US008536956B2

(12) United States Patent
Tamaru et al.

(10) Patent No.: US 8,536,956 B2
(45) Date of Patent: Sep. 17, 2013

(54) DIRECTIONAL COUPLER

(71) Applicant: Murata Manufacturing Co., Ltd., Nagaokakyo (JP)

(72) Inventors: Ikuo Tamaru, Nagaokakyo (JP); Hirokazu Yazaki, Nagaokakyo (JP); Hiroshi Masuda, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/754,956

(22) Filed: Jan. 31, 2013

(65) Prior Publication Data

US 2013/0141184 A1 Jun. 6, 2013

Related U.S. Application Data

(63) Continuation of application No. PCT/JP2011/059158, filed on Apr. 13, 2011.

(30) Foreign Application Priority Data

Aug. 3, 2010 (JP) ................................ 2010-174576

(51) Int. Cl.
*H01P 5/18* (2006.01)
*H03H 7/38* (2006.01)

(52) U.S. Cl.
USPC .......................................... 333/112; 333/116

(58) Field of Classification Search
USPC .................. 333/109, 110, 111, 112, 116, 25, 333/26
See application file for complete search history.

(56) References Cited

U.S. PATENT DOCUMENTS

| | | | | |
|---|---|---|---|---|
| 5,006,821 | A * | 4/1991 | Tam | 333/116 |
| 5,363,071 | A * | 11/1994 | Schwent et al. | 333/111 |
| 5,424,694 | A | 6/1995 | Maloratsky et al. | |
| 5,886,589 | A * | 3/1999 | Mourant | 333/26 |
| 7,907,032 | B2 * | 3/2011 | Yamamoto et al. | 333/116 |
| 2003/0117230 | A1 | 6/2003 | Shin | |

FOREIGN PATENT DOCUMENTS

| | | | |
|---|---|---|---|
| JP | 58-61503 | U | 4/1983 |
| JP | 10-022707 | A | 1/1998 |
| JP | 11-220312 | A | 8/1999 |
| JP | 11-261313 | A | 9/1999 |
| JP | 2002-330009 | A | 11/2002 |
| JP | 2003-198223 | A | 7/2003 |
| JP | 2005-203824 | A | 7/2005 |

OTHER PUBLICATIONS

Official Communication issued in International Patent Application No. PCT/JP2011/059158, mailed on Jun. 21, 2011.

* cited by examiner

*Primary Examiner* — Dean O Takaoka
(74) *Attorney, Agent, or Firm* — Keating & Bennett, LLP

(57) ABSTRACT

In a directional coupler, sub-lines or main lines are electromagnetically coupled to each other to degrade isolation characteristics. A capacitor is located between the sub-lines or between the main lines to cause the isolation characteristics to have poles in order to improve the isolation characteristics of the directional coupler.

18 Claims, 9 Drawing Sheets

10

DIRECTIONAL COUPLER

BACKGROUND OF THE INVENTION

1. Field of the Invention

The present invention relates to a directional coupler for communication equipment.

2. Description of the Related Art

For example, a directional coupler described in Japanese Unexamined Patent Application Publication No. 11-261313 is known. As shown in FIG. 9, the directional coupler described in Japanese Unexamined Patent Application Publication No. 11-261313 includes multiple dielectric layers that are arranged on one another. Electrode patterns are provided on the dielectric layers. The directional coupler includes a first main line 33, a second main line 34, and a first sub-line 35, each of which is composed of a strip line. Both the first main line 33 and the second main line 34 are coupled to the first sub-line 35. The directional coupler is capable of realizing the basic operation in the same manner even if the function of the main lines is exchanged with that of the sub-line because of its structure. The same applies to a technical problem and solutions to the problem described below.

However, since the first main line 33 and the second main line 34 are electromagnetically coupled to a common part of the first sub-line 35 in the directional coupler described in Japanese Unexamined Patent Application Publication No. 11-261313, there is a problem in that the isolation between the first main line 33 and the second main line 34 is poor.

SUMMARY OF THE INVENTION

In order to resolve the above problems, preferred embodiments of the present invention provide a directional coupler having excellent isolation between main lines or between sub-lines.

A directional coupler according to a preferred embodiment of the present invention includes a main line including a first terminal and a second terminal; a first sub-line that is electromagnetically coupled to the main line and that includes a third terminal and a fourth terminal; a second sub-line that is electromagnetically coupled to the main line and that includes a fifth terminal and a sixth terminal; and a capacitive element connected between the fourth terminal and the fifth terminal. The fourth terminal and the fifth terminal are each terminated with a load.

With the above configuration, it is possible to improve the isolation characteristics between the first and second sub-lines in the directional coupler.

A directional coupler according to a preferred embodiment of the present invention preferably includes a multilayer body including a plurality of insulating layers that are stacked on each other. The main line, the sub-lines, and the capacitive element are preferably defined by conductive layers provided in the multilayer body.

With the above configuration, it is possible to improve the isolation characteristics between the first and second sub-lines to reduce the size of the directional coupler.

In the directional coupler according to a preferred embodiment of the present invention, a first main surface of the directional coupler is preferably used as a mounting surface, and the capacitive element is preferably provided between the main line and the sub-lines and the first main surface in the multilayer body.

With the above configuration, it is possible to reduce various electromagnetic effects of the mounting surface on the directional coupler that is mounted on the mounting surface.

In a circuit apparatus according to another preferred embodiment of the present invention, the directional coupler according to one of the above-described preferred embodiments of the present invention is preferably mounted on a board having a shielding effect.

With the above configuration, it is not necessary to provide a ground layer in the directional coupler which reduces the size of the directional coupler.

According to various preferred embodiments of the present invention, it is possible to improve the isolation characteristics between the first and second sub-lines in the directional coupler.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will herein be described in detail with reference to the attached drawings.

Figure 1:
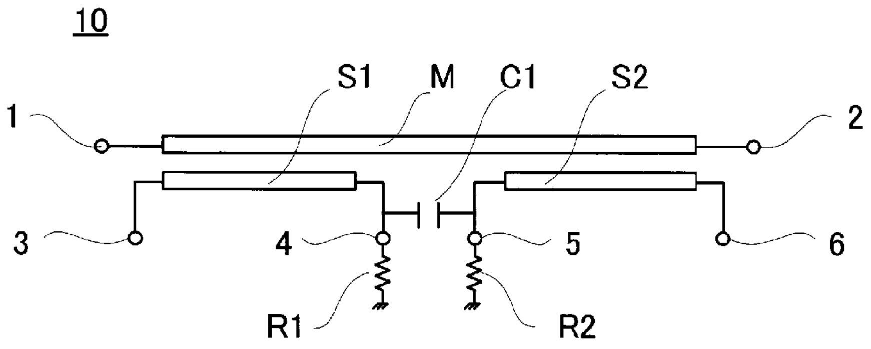
FIG. 1 is a circuit diagram of a directional coupler according to a preferred embodiment of the present invention.

FIG. 1 is a circuit diagram of a directional coupler 10 according to a preferred embodiment of the present invention.

Figure 2A:
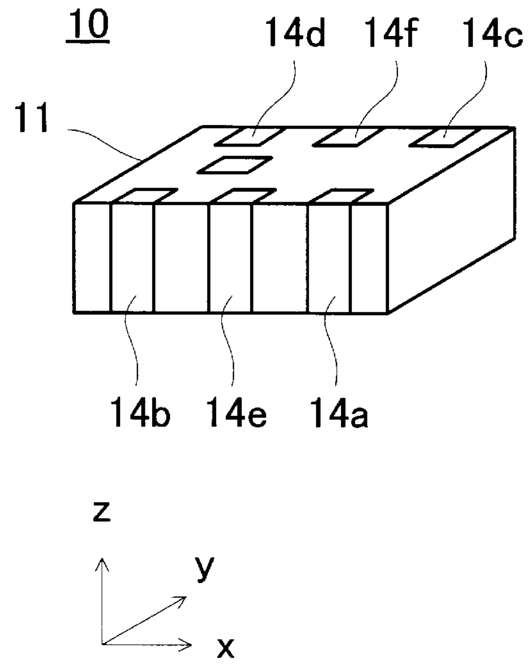
FIGS. 2A and 2B include an external perspective view and a top view of the directional coupler according to a preferred embodiment of the present invention.
Figure 2B:
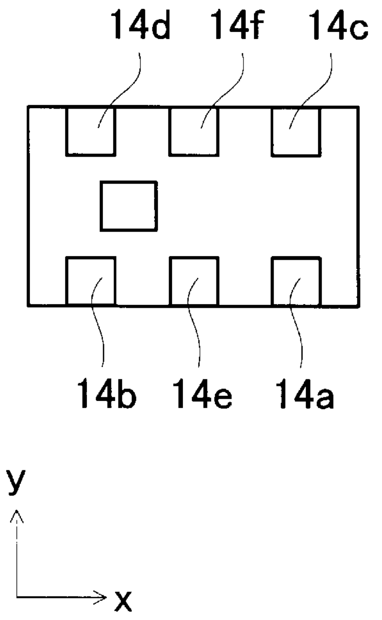
Figure 3:
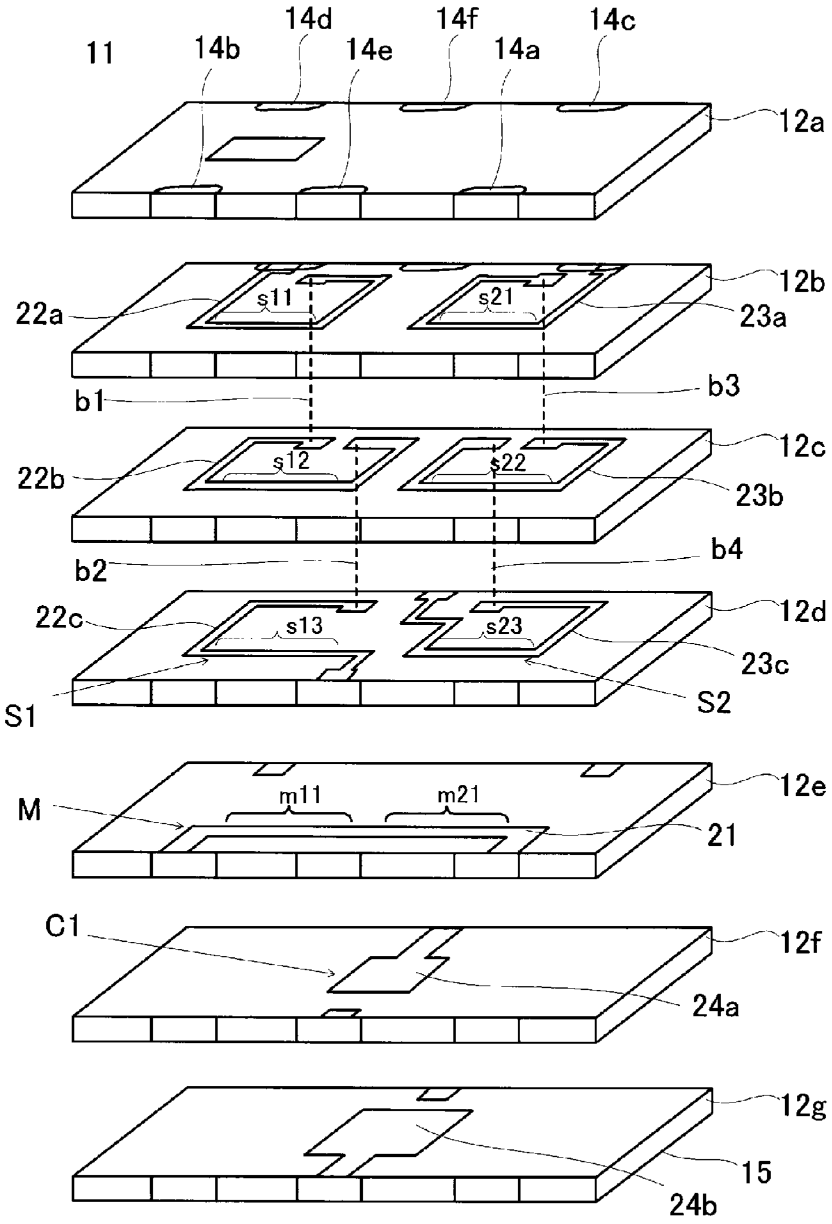
FIG. 3 is an exploded perspective view of a multilayer body in the directional coupler according to a preferred embodiment of the present invention.

FIGS. 2A and 2B include external views of the directional coupler 10. FIG. 3 is an exploded perspective view of the directional coupler 10.

An exemplary circuit configuration of the directional coupler 10 will now be described. The directional coupler 10 includes external electrodes (terminals) 1 to 6, a main line M, sub-lines S1 and S2, termination resistors R1 and R2, and a capacitive element C1. The main line M is connected between the external electrodes 1 and 2. The sub-line S1 is connected between the external electrodes 3 and 4 and is electromagnetically coupled to the main line M. The sub-line S2 is connected between the external electrodes 5 and 6 and is electromagnetically coupled to the main line M. One end of the termination resistor R1 is connected to the external electrode 4 and the other end thereof is grounded. One end of the termination resistor R2 is connected to the external electrode 5 and the other end thereof is grounded. The capacitive element C1 is connected between the external electrodes 4 and 5.

Signals transmitted on the main line M of the directional coupler 10 include forward-direction signals that enter the directional coupler 10 from the external electrode 1 and exit from the external electrode 2 and backward-direction signals generated by the forward-direction signals that are reflected from a downstream circuit, enter the directional coupler 10 from the external electrode 2, and exit from the external electrode 1. For the forward-direction signals, the external electrode 1 functions as an input port and the external electrode 2 functions as an output port. For the backward-direction signals, the external electrode 2 functions as the input port and the external electrode 1 functions as the output port. The external electrode 3 functions as a coupling port for the forward-direction signals and the external electrode 6 functions as the coupling port for the backward-direction signals. The external electrodes 4 and 5 are each preferably used as a 50 Ω-termination port, for example.

In the directional coupler 10 having the above configuration, the electromagnetic coupling between the main line M and the sub-line S1 causes a signal having power that is proportional to the power of the forward-direction signals to be output from the external electrode 3. The electromagnetic coupling between the main line M and the sub-line S2 causes a signal having power that is proportional to the power of the backward-direction signals to be output from the external electrode 6. A predetermined frequency of these signals preferably is, for example, a frequency between 824 MHz and 915 MHz (Global System for Mobile Communications (GSM) 800/900) or a frequency between 1,710 MHz and 1,910 MHz (GSM1800/1900). Signals output from the external electrodes 3 and 6 of the directional coupler are preferably input into an automatic gain control apparatus (not shown).

A coupling characteristic, an isolation characteristic, and a directional characteristic are preferably used as the main characteristics representing the performance of the directional coupler. The coupling characteristic indicates the relationship between the ratio in power between a signal input into the input port and a signal output from the coupling port, that is, an amount-of-attenuation S (3, 1) and the frequency. The isolation characteristic indicates the relationship between the ratio in power between a signal input from the output port and a signal output from the coupling port (that is, the amount-of-attenuation S (3, 2)) and the frequency. The directional characteristic indicates the relationship between the ratio between the coupling characteristic and the isolation characteristic (that is, the amount-of-attenuation S (3, 2)/(3, 1)) and the frequency.

A specific configuration of the directional coupler 10 will now be described. FIG. 2A is an external perspective view of the directional coupler 10. FIG. 2B is a top view of the directional coupler 10. FIG. 3 is an exploded perspective view of a multilayer body 11 of the directional coupler 10 according to a preferred embodiment of the present invention. The layering direction is defined as the z-axis direction, the long-side direction of the directional coupler 10 in a plan view from the z-axis direction is defined as the x-axis direction, and the short-side direction of the directional coupler 10 in a plan view from the z-axis direction is defined as the y-axis direction in the following description. The x axis, the y axis, and the z axis are orthogonal to each other.

The multilayer body 11 includes external electrodes 14*a* to 14*f* (collectively referred to as an external electrode 14), the main line M, the sub-lines S1 and S2, and the capacitive element C1, as shown in FIGS. 2A and 2B and FIG. 3.

The multilayer body 11 preferably has a rectangular or substantially rectangular parallelepiped shape, for example, as shown in FIGS. 2A and 2B. The multilayer body 11 preferably includes insulating layers 12*a* to 12*g* (collectively referred to as an insulating layer 12) that are arranged from the positive direction to the negative direction of the z-axis direction in this order, as shown in FIG. 3. A mounting surface 15 of the directional coupler 10 is at the rear surface side of the layering surface of the insulating layer 12*g*, which is the lowermost layer. The insulating layer 12 preferably is made of dielectric ceramics and has a rectangular or substantially rectangular shape.

The external electrodes 14*a*, 14*e*, and 14*b* are provided on a side at the negative direction side of the y-axis direction of the multilayer body 11 so as to be arranged from the positive direction side to the negative direction side of the x-axis direction in this order and is arranged so as to extend over all the layers in the z-axis direction. The external electrodes 14*c*, 14*f*, and 14*d* are provided on a side at the positive direction side of the y-axis direction of the multilayer body 11 so as to be arranged from the positive direction side to the negative direction side of the x-axis direction in this order and is arranged so as to extend over all the layers in the z-axis direction.

The main line M preferably includes a line portion 21, as shown in FIG. 3. The line portion 21 preferably is a linear conductive layer provided on the insulating layer 12*e* and is connected to the external electrodes 14*a* and 14*b*.

The sub-line S1 preferably includes line portions 22*a*, 22*b*, and 22*c* and via-hole conductors b1 to b2, as shown in FIG. 3. The sub-line S1 has a helical shape in which the sub-line S1 circles counterclockwise from the positive side to the negative side of the z-axis direction. In the sub-line S1, an upper-side end in the counterclockwise circle is called an upper end and a lower-side end in the counterclockwise circle is called a lower end.

The line portion 22*a* is a linear conductive layer provided on the insulating layer 12*b*. The upper end of the line portion 22*a* is connected to the external electrode 14*d*. The line portion 22*b* is a linear conductive layer provided on the insulating layer 12*c*. The line portion 22*c* is a linear conductive layer provided on the insulating layer 12*d*. The lower end of the line portion 22*c* is connected to the external electrode 14*e*. The via-hole conductor b1 penetrates through the insulating layer 12*b* in the z-axis direction and connects the line portion 22*a* to the line portion 22*b*. The via-hole conductor b2 penetrates through the insulating layer 12*c* in the z-axis direction and connects the line portion 22*b* to the line portion 22*c*.

The sub-line S1 is connected between the external electrodes 14*d* and 14*e* in the above manner. In a plan view from the z-axis direction, an area m11 of the main line M opposes areas s11, s12, and s13 of the sub-line S1 so as to be parallel or substantially parallel to the areas s11, s12, and s13. The main line M is electromagnetically coupled to the sub-line S1 with these areas.

The sub-line S2 preferably includes line portions 23*a*, 23*b*, and 23*c* and via-hole conductor b3 to b4, as shown in FIG. 3. The sub-line S2 has a helical shape in which the sub-line S2 circles clockwise from the positive side to the negative side of the z-axis direction. In the sub-line S2, an upper-side end in the clockwise circle is called an upper end and a lower-side end in the clockwise circle is called a lower end.

The line portion 23*a* preferably is a linear conductive layer provided on the insulating layer 12*b*. The upper end of the line portion 23*a* is connected to the external electrode 14*c*. The line portion 23*b* preferably is a linear conductive layer provided on the insulating layer 12*c*. The line portion 23*c* preferably is a linear conductive layer provided on the insulating layer 12*d*. The lower end of the line portion 23*c* is connected to the external electrode 14*f*. The via-hole conductor b3 penetrates through the insulating layer 12*b* in the z-axis direction and connects the line portion 23*a* to the line portion 23*b*. The via-hole conductor b4 penetrates through the insulating layer 12*c* in the z-axis direction and connects the line portion 23*b* to the line portion 23*c*.

The sub-line S2 is connected between the external electrodes 14c and 14*f* in the above manner. In a plan view from the z-axis direction, an area m21 of the main line M opposes areas s21, s22, and s23 of the sub-line S2 so as to be parallel or substantially parallel to the areas s21, s22, and s23. The main line M is electromagnetically coupled to the sub-line S2 with these areas.

The capacitive element C1 preferably includes planar conductive layers 24*a* and 24*b*. The planar conductive layer 24*a* is provided on the insulating layer 12*f* and is connected to the external electrode 14*f*. The planar conductive layer 24*b* is provided on the insulating layer 12*g* and is connected to the external electrode 14*e*. The planar conductive layers 24*a* and 24*b* each preferably have a rectangular or substantially rectangular shape and are overlaid with each other in a plan view from the z-axis direction. Accordingly, a capacitance occurs between the planar conductive layers 24*a* and 24*b*. The capacitive element C1 is connected between the external electrode 14*f* and the external electrode 14*e*.

It is possible to improve the isolation characteristic and the directional characteristic with the directional coupler 10 having the above configuration.

Figure 4A:
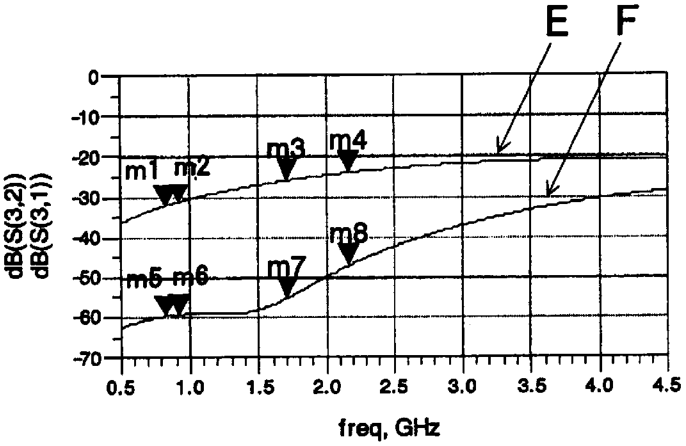
FIGS. 4A and 4B include characteristic diagrams of the directional coupler according to a preferred embodiment of the present invention.
Figure 4B:
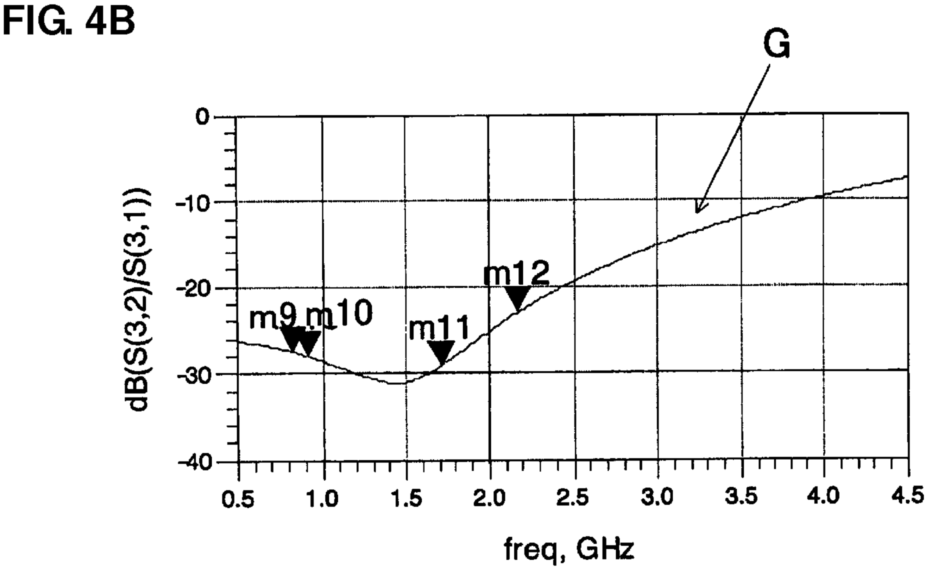
Figure 5A:
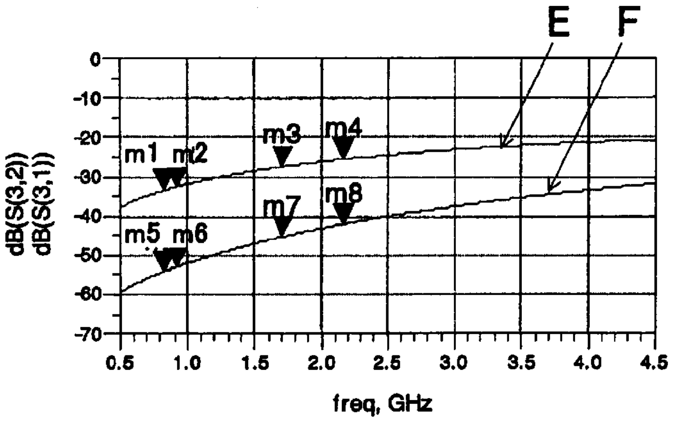
FIGS. 5A and 5B include characteristic diagrams of a directional coupler of a modification of a preferred embodiment of the present invention.
Figure 5B:
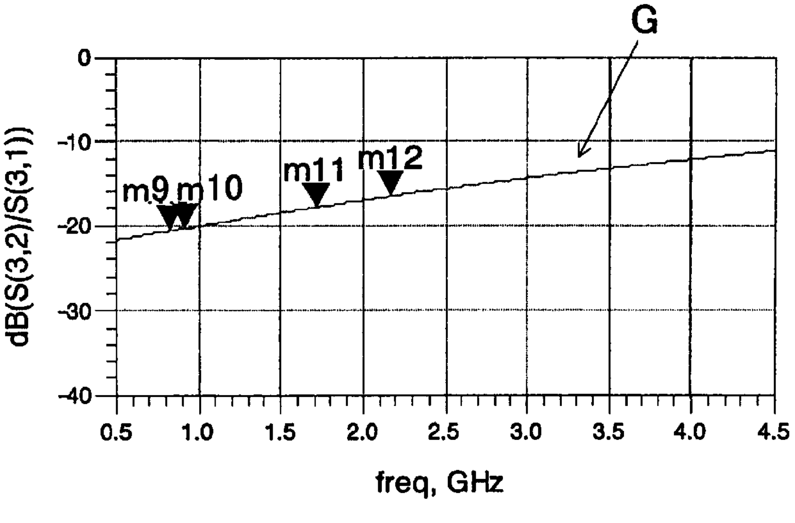
Figure 6A:
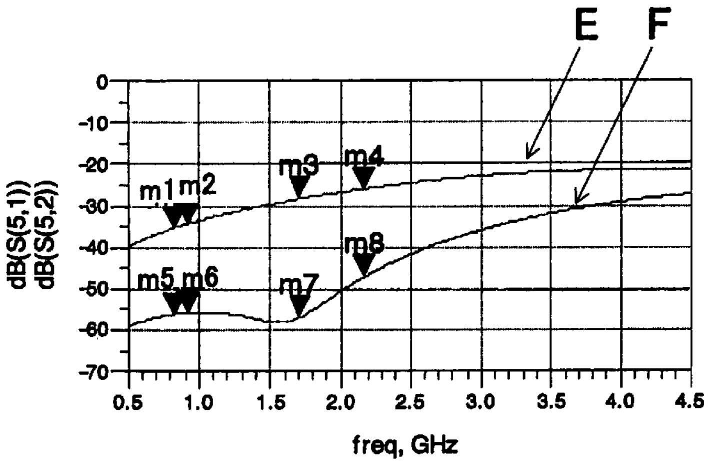
FIGS. 6A and 6B include characteristic diagrams of the directional coupler according to a preferred embodiment of the present invention.
Figure 6B:
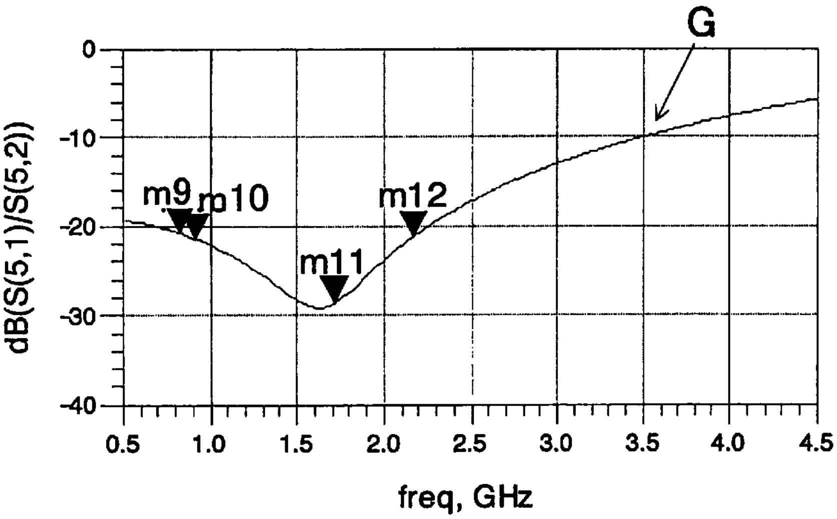
Figure 7A:
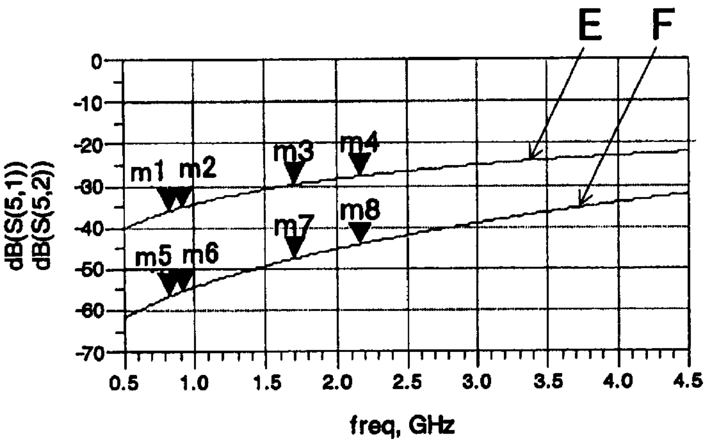
FIGS. 7A and 7B include characteristic diagrams of the directional coupler of a modification of a preferred embodiment of the present invention.
Figure 7B:
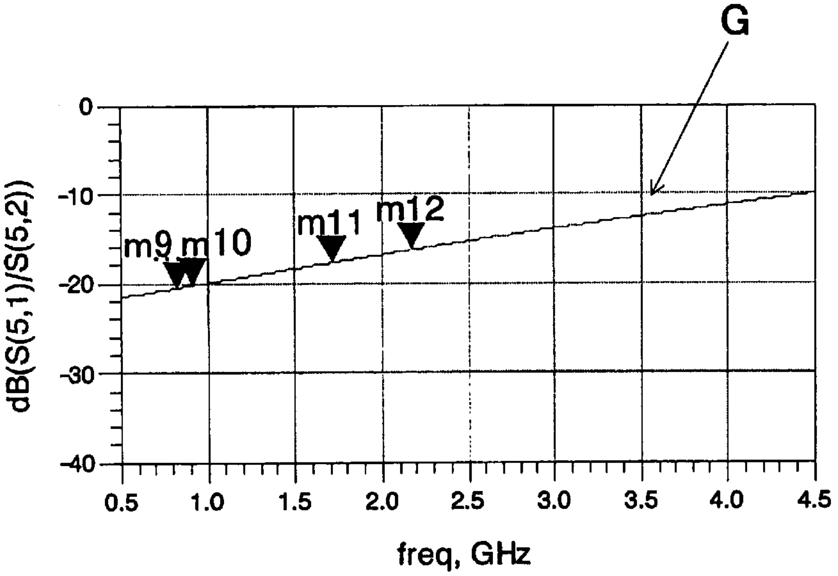

FIG. 4A is a graph indicating a coupling characteristic E and an isolation characteristic F of a forward-direction signal of the directional coupler 10 in FIG. 1 and FIG. 4B is a graph indicating a directional characteristic G thereof. FIG. 5A is a graph indicating the coupling characteristic E and the isolation characteristic F of a forward-direction signal in a configuration in the related art according to a modification and FIG. 5B is a graph indicating the directional characteristic G thereof. FIG. 6A is a graph indicating the coupling characteristic E and the isolation characteristic F of a backward-direction signal of the directional coupler 10 in FIG. 1 and FIG. 6B is a graph indicating the directional characteristic G thereof. FIG. 7A is a graph indicating the coupling characteristic E and the isolation characteristic F of a backward-direction signal in the configuration in the related art and FIG. 7B is a graph indicating the directional characteristic G thereof. Marker frequencies m1, m5, and m9 in the respective graphs indicate lower cut-off frequencies of GSM800/900, marker frequencies m2, m6, and m10 in the respective graphs indicate upper cut-off frequencies of GSM800/900, marker frequencies m3, m7, and m11 in the respective graphs indicate lower cut-off frequencies of GSM1800/1900, and maker frequencies m4, m8, and m12 in the respective graphs indicate upper cut-off frequencies of GSM1800/1900.

In the directional coupler having the configuration in the related art, that is, in the circuit configuration before the capacitive element C1 is added in FIG. 1, the isolation characteristic F and the directional characteristic G are increased with the increasing frequency, as shown in FIGS. 5A and 5B. In contrast, in the directional coupler 10 in FIG. 1, the inductance of the sub-lines and the capacitance of the capacitive element cause series resonance and poles to appear around 1.5 GHz in the isolation characteristic F and the directional characteristic G. In addition, the frequencies at the poles are capable of being adjusted by adjusting the capacitance value of the capacitive element. FIGS. 4A and 4B include the graphs when the capacitance value is adjusted so that the most preferable isolation characteristic is acquired in a predetermined frequency domain. FIGS. 4A and 4B and FIGS. 5A and 5B show that the addition of the capacitive element C1 increases the amount of attenuation, in addition to the isolation characteristic and the directional characteristic.

Since the lines are designed so as to be symmetrical to each other in terms of their lengths with respect to the input-output directions and the symmetry is maintained even with the capacitive element C1 added in the directional coupler 10, the above advantages for the forward-direction signals are also achieved for the backward-direction signals, as shown in FIG. 6 and FIG. 7.

Furthermore, since the directional coupler 10 has symmetry, it is possible to receive the forward-direction signals and the backward-direction signals at the same sensitivity. Accordingly, it is possible to apply integrated circuits (ICs) having the same specifications to both of the sub-lines S1 and S2.

Figure 8:
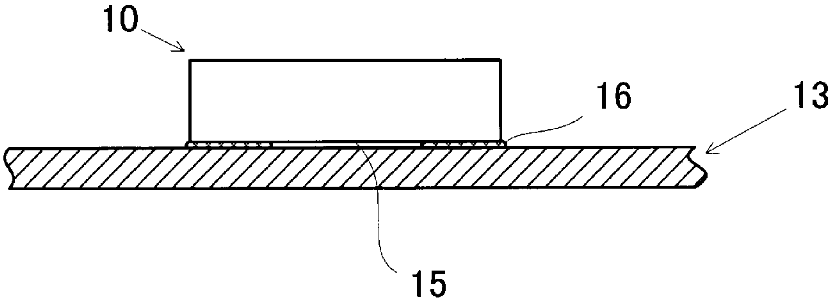
FIG. 8 is a diagram for describing how the directional coupler according to a preferred embodiment of the present invention is mounted on a mounting surface.
Figure 9:
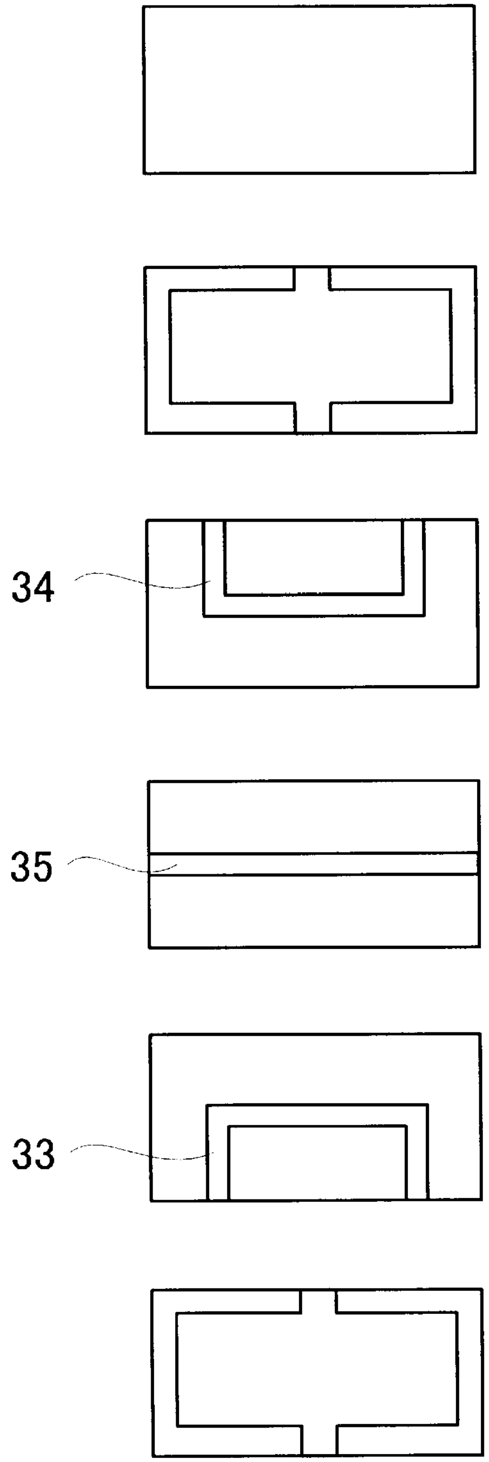
FIG. 9 PRIOR ART
FIG. 9 is a diagram for describing a layering structure of a directional coupler in the related art.

The directional coupler 10 is fixed to a mounting board 13 shown in FIG. 8 with solder 16 with the mounting surface 15 opposing the mounting board 13. Various electrode patterns are provided on or in the mounting board 13 although not shown in FIG. 8. Various electromagnetic waves are emitted from the electrode patterns.

In the directional coupler 10, the layers on which the sub-lines S1 and S2 are provided, the layer on which the main line M is provided, the layers on which the capacitive element C1 is provided, and the mounting surface are arranged in this order from the positive direction side to the negative direction side of the z-axis direction. Accordingly, the capacitive element C1 is positioned between the main line M and the sub-lines S1 and S2, which are signal lines of the directional coupler 10, and the mounting board. As a result, the signal lines of the directional coupler 10 are kept away from the mounting board by the distance corresponding to the capacitive element C1 so as to reduce electromagnetic effects of the various electrode patterns on or in the mounting board on the directional coupler 10.

Although the external electrodes 4 and 5 preferably have a 50 Ω termination impedance at the termination resistors R1 and R2, respectively, the termination impedance may be shifted from 50 Ω.

The directional coupler 10 preferably has no shield conductive layer having ground voltage in the multilayer body. Accordingly, in a circuit apparatus (not shown) including the directional coupler, shielding is performed at the side of electronic components or the board so that no electromagnetic mutual interference occurs between the directional coupler and the electronic components or the electrode patterns on or in the mounting board. As a result, it is possible to reduce the space where the shield conductive layer or a shield terminal is provided and the material and the manufacturing cost of the shield conductive layer and the shield terminal in the directional coupler 10.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A directional coupler comprising:

a main line including a first terminal and a second terminal;

a first sub-line that is electromagnetically coupled to the main line and that includes a third terminal and a fourth terminal;

a second sub-line that is electromagnetically coupled to the main line and that includes a fifth terminal and a sixth terminal; and a capacitive element connected between the fourth terminal and the fifth terminal; wherein the fourth terminal and the fifth terminal are each terminated with a load.

2. The directional coupler according to claim 1, further comprising a multilayer body including a plurality of insulating layers that are stacked on each other, wherein the main line, the sub-lines, and the capacitive element are defined by conductive layers provided in the multilayer body.

3. The directional coupler according to claim 2, wherein a surface of the directional coupler defines a mounting surface, and the capacitive element is provided between the main line and the sub-lines and the main surface in the multilayer body.

4. The directional coupler according to claim 1, further comprising external electrodes, wherein the main line is connected between the external electrodes.

5. The directional coupler according to claim 4, wherein the first sub-line is connected between a pair of the external electrodes and is electromagnetically coupled to the main line.

6. The directional coupler according to claim 4, wherein the second sub-line is connected between a pair of the external electrodes and is electromagnetically coupled to the main line.

7. The directional coupler according to claim 4, wherein the capacitive element is connected between a pair of the external electrodes.

8. The directional coupler according to claim 4, wherein one of the external electrodes defines an input port and one of the external electrodes defines an output port.

9. The directional coupler according to claim 4, wherein one of the external electrodes defines a coupling port.

10. The directional coupler according to claim 4, wherein one of the external electrodes defines a 50 Ω termination port.

11. The directional coupler according to claim 1, further comprising a termination resistor including a first end connected to an external electrode and a second end connected to ground.

12. The directional coupler according to claim 1, further comprising a multilayer body including at least one insulating layer, the main line, the first sub-line, the second sub-line and the capacitive element.

13. The directional coupler according to claim 12, wherein the main line includes a linear conductive layer located on the at least one insulating layer.

14. The directional coupler according to claim 12, wherein the first sub-line includes a plurality of line portions and via hole conductors.

15. The directional coupler according to claim 12, wherein the second sub-line includes a plurality of line portions and via hole conductors.

16. The directional coupler according to claim 12, wherein the capacitive element includes planar conductive layers located on respective ones of the at least one insulating layer.

17. The directional coupler according to claim 1, wherein the directional coupler is mounted on a mounting board such that the capacitive element is located between the main line and the first and second sub-lines and the mounting board such that signal lines of the directional coupler are spaced away from the mounting board by a dimension of the capacitive element.

18. The directional coupler according to claim 1, wherein the directional coupler does not include any shield conductive layer.

* * * * *